United States Patent
Hatanaka et al.

(10) Patent No.: US 7,001,705 B2
(45) Date of Patent: Feb. 21, 2006

(54) POSITIVELY PHOTOSENSITIVE RESIN COMPOSITION AND METHOD OF PATTERN FORMATION

(75) Inventors: Tadashi Hatanaka, Chiba (JP); Takayasu Nihira, Chiba (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/510,704

(22) PCT Filed: Apr. 18, 2003

(86) PCT No.: PCT/JP03/04954

§ 371 (c)(1),
(2), (4) Date: Oct. 15, 2004

(87) PCT Pub. No.: WO03/087941

PCT Pub. Date: Oct. 23, 2003

(65) Prior Publication Data

US 2005/0147914 A1    Jul. 7, 2005

(30) Foreign Application Priority Data

Apr. 18, 2002    (JP) .............................. 2002-115566

(51) Int. Cl.
     *G03F 7/023*    (2006.01)
     *G03F 7/30*    (2006.01)

(52) U.S. Cl. ...................... 430/191; 430/165; 430/192; 430/193; 430/280.1; 430/326

(58) Field of Classification Search ................ 430/191, 430/192, 193, 165, 326, 280.1
See application file for complete search history.

(56) References Cited

U.S. PATENT DOCUMENTS

| | | | |
|---|---|---|---|
| 6,140,019 A * | 10/2000 | Sakurai et al. | 430/288.1 |
| 6,306,555 B1 * | 10/2001 | Schulz et al. | 430/270.1 |
| 6,399,267 B1 * | 6/2002 | Nishimura et al. | 430/192 |
| 6,475,692 B1 * | 11/2002 | Jarek et al. | 430/165 |
| 6,746,812 B1 * | 6/2004 | Watanabe et al. | 430/165 |
| 6,797,450 B1 * | 9/2004 | Suzuki et al. | 430/166 |

FOREIGN PATENT DOCUMENTS

| | | |
|---|---|---|
| EP | 1 074 887 | 2/2001 |
| EP | 1188580 | 3/2002 |
| JP | 1-307228 | 12/1989 |
| JP | 8-29608 | 2/1996 |
| JP | 2002-23363 | 1/2002 |
| JP | 2002-287351 | 10/2002 |

* cited by examiner

*Primary Examiner*—John S. Chu
(74) *Attorney, Agent, or Firm*—Oblon, Spivak, McClelland, Maier & Neustadt P.C.

(57) ABSTRACT

The present invention provides a positive photosensitive resin composition which can be developed with a tetramethylammonium hydroxide aqueous solution with a usual concentration, has high sensitivity and excellent resolution, and is excellent in heat resistance, planarization properties, transparency, low water absorption or the like. Further, the present invention provides a method for arbitrarily forming a pattern having a semicircular or trapezoidal section by using the composition. The positive photosensitive resin composition of the present invention comprises an alkali-soluble resin, a 1,2-quinone diazide compound, a crosslinking compound having at least two epoxy groups and a surfactant, and the alkali-soluble resin is a copolymer comprising a carboxylic group-containing acrylic monomer, a hydroxyl group-containing acrylic monomer and an N-substituted maleimide as essential components. By changing the postbake conditions, the composition can arbitrarily form a pattern having a semicircular or trapezoidal section.

18 Claims, 1 Drawing Sheet

POSITIVELY PHOTOSENSITIVE RESIN COMPOSITION AND METHOD OF PATTERN FORMATION

TECHNICAL FIELD

The present invention relates to a positive photosensitive resin composition. More particularly, the present invention relates to a positive photosensitive resin composition suitable as a material for forming an interlayer dielectric film of a thin film transistor (TFT) to be used for a liquid crystal display device (LCD), a protective film and a planarization film for a color filter, an uneven film under an Al film used as a reflector of a reflecting display, a microlens material, a dielectric film in an organic EL device or the like and a method for forming a pattern of it.

BACKGROUND ART

Generally, display materials such as liquid crystal display devices or organic EL devices have an electrode overcoating, a planarization film, a dielectric film and the like made of an acrylic resin, a novolac resin, a polyimide resin and the like. These overcoatings, planarization films and dielectric films are formed in desired patterns by photolithography.

However, up to now, it has been difficult to obtain films which have heat resistance, transparency and adhesion while securing sufficient sensitivity during exposure and development. Further, despite their high transparency and sensitivity, alkali-soluble acrylic photosensitive resins generally have low heat resistance, and are difficult to develop with 2.38 wt % aqueous tetramethylammonium hydroxide solution usually used for photoresist development without dilution.

On the other hand, usual thermosetting photosensitive acrylic resins contain polymers having a low glass transition temperature as the base and therefore can form only patterns having a semicircular profile because reflow occurs before crosslinking. Further, it is necessary to increase the crosslinking rate above the reflow rate to obtain patterns having a trapezoidal profile. Use of a copolymer of an unsaturated carboxylic acid and an epoxy group-containing unsaturated compound facilitates thermal crosslinking and affords resin compositions which can form patterns having a trapezoidal profile by undergoing crosslinking before reflow. However, there was a problem that these resin such as compositions have poor storage stability.

The present invention has been made under these circumstances, and relates to a positive photosensitive composition capable of being developed with 2.38 wt % aqueous tetramethylammonium hydroxide solution usually used in a photoresist step, and has high sensitivity, photosensitive properties which ensure excellent resolution and excellent properties such as heat resistance, a planarization property, transparency and low water absorption. Further, the present invention provides a positive photosensitive resin composition capable of arbitrarily forming a pattern with a semicircular or trapezoidal section after curing depending on the postbake conditions, and a method for forming a pattern.

DISCLOSURE OF THE INVENTION

The present inventors have conducted extensive studies to solve the above-mentioned problems and as a result, the present invention summarized below has been accomplished.

In one embodiment a positive photosensitive resin composition comprising an alkali-soluble resin, a 1,2-quinone diazide compound, a crosslinking compound having at least two epoxy groups and a surfactant, wherein the above alkali-soluble resin is a copolymer comprising a carboxyl group-containing acrylic monomer, a hydroxyl group-containing acrylic monomer and an N-substituted maleimide as essential components.

In another embodiment the positive photosensitive resin composition comprises the 1,2-quinone diazide compound in an amount of from 5 to 100 parts by weight, the crosslinking compound having at least two epoxy groups in an amount of from 1 to 50 parts by weight, and the surfactant in an amount of from 0.01 to 2 parts by weight, based on 100 parts by weight of the alkali-soluble resin component.

In another embodiment the number average molecular weight of the copolymer is from 2,000 to 9,000.

In another embodiment the copolymer comprises the carboxyl group-containing acrylic monomer in an amount of from 5 to 30 mol %, the hydroxyl group-containing acrylic monomer in an amount of from 5 to 50 mol % and the N-substituted maleimide in an amount of from 10 to 70 mol % as monomer components.

In another embodiment the surfactant is a fluorine type surfactant.

The invention includes a method for forming a pattern, which uses one or more of the other embodiments of the positive photosensitive resin composition wherein the postbake conditions are charged to arbitrarily form a pattern having a semicircular or trapezoidal section.

MODE FOR CARRYING OUT THE INVENTION

Figure 1:
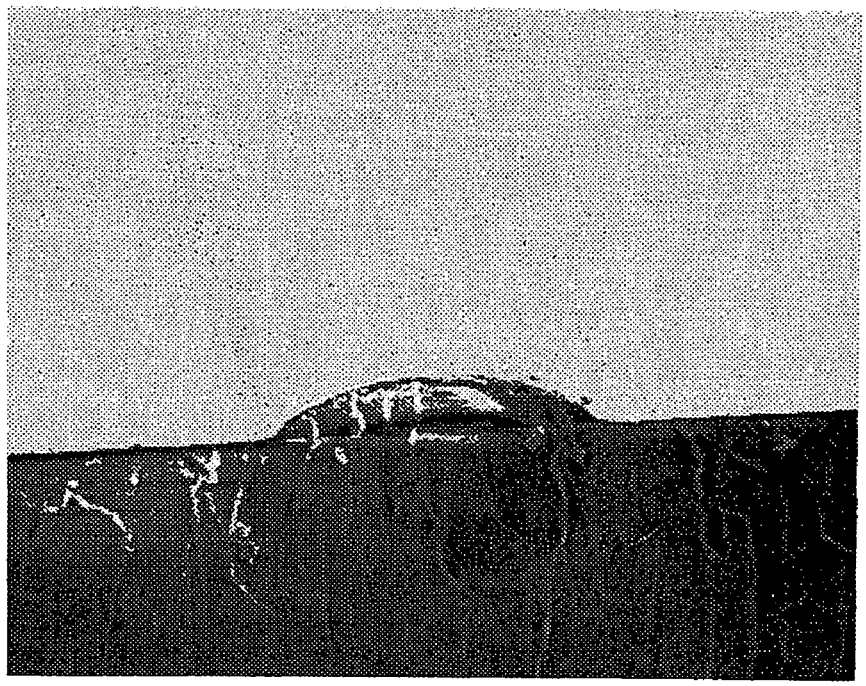
FIG. 1 is a scanning electron micrograph of the pattern having a semicircular section obtained in Example 1.

Now, the photosensitive resin composition of the present invention will be described in detail.

Alkali-soluble Resin

The alkali-soluble resin contained in the positive photosensitive resin composition of the present invention is a copolymer of a carboxyl group-containing acrylic monomer, a hydroxyl group-containing acrylic monomer and an N-substituted maleimide (hereinafter also referred to as an alkali-soluble resin copolymer).

The carboxyl group-containing acrylic monomer as a constituent of the alkali-soluble resin copolymer is not particularly limited. As specific examples, acrylic acid and methacrylic acid may be mentioned. Such carboxyl group-containing acrylic monomers may be used alone or in combination of two or more of them.

The ratio of the carboxyl group-containing acrylic monomer in the alkali-soluble resin copolymer is preferably from 5 to 30 mol %, more preferably from 5 to 25 mol %, most preferably from 5 to 20 mol %. If the ratio of the carboxyl group-containing acrylic monomer is less than 5 mol %, the alkali solubility of the copolymer will be insufficient, and if the ratio is more than 30 mol %, the resolution will be low. Further, if the carboxyl group-containing acrylic monomer is contained in a large amount, the storage stability of the positive photosensitive resin composition of the present invention tends to be poor.

The hydroxyl group-containing acrylic monomer as a constituent of the alkali-soluble resin copolymer is not particularly limited. As specific examples, 2-hydroxyethyl acrylate, 2-hydroxypropyl acrylate, 2-hydroxyethyl methacrylate and 2-hydroxypropyl methacrylate may be mentioned. Such hydroxyl group-containing acrylic monomers may be used alone or in combination of two or more of them.

The ratio of the hydroxyl group-containing acrylic monomer in the alkali-soluble resin copolymer is preferably from 5 to 50 mol %, more preferably from 10 to 40 mol %, most preferably from 20 to 30 mol %. If the ratio of the hydroxyl group-containing acrylic monomer is less than 5 mol %, the alkali-soluble resin copolymer will dissolve in an alkali fast without leaving a substantial process margin. Further, if the ratio is more than 50 mol %, water absorption of the resin will be high after curing.

The N-substituted maleimide as a constituent of the alkali-soluble resin copolymer is not particularly limited. As specific examples, cyclohexylmaleimide, phenylmaleimide, methylmaleimide and ethylmaleimide may be mentioned. It is preferred not to have an aromatic ring in view of transparency, and cyclohexylmaleimide is most suitable in view of development, transparency and heat resistance.

The ratio of the N-substituted maleimide in the alkali-soluble resin copolymer is preferably from 10 to 70 mol %, more preferably from 15 to 50 mol %, most preferably from 20 to 40 mol %. If the ratio of the N-substituted maleimide is less than 10 mol %, the alkali-soluble resin copolymer will have a low Tg, and therefore can hardly form a pattern with a trapezoidal profile, and further, the heat resistance of the resulting pattern will deteriorate. If the ratio is more than 70 mol %, the pattern profile can hardly be controlled.

The alkali-soluble resin copolymer may also contain other copolymerizable acrylic monomers and the like, in addition to the carboxyl group-containing acrylic monomer, the hydroxyl group-containing acrylic monomer and the N-substituted maleimide. Such other acrylic monomers may, for example, be (meth)acrylates such as methyl (meth)acrylate, ethyl (meth)acrylate, n-butyl (meth)acrylate, isobutyl (meth) acrylate and 2-methoxyethyl (meth)acrylate; fluorine-containing (meth)acrylates such as 2,2,2-trifluoroethyl (meth) acrylate, 2,2,3,3,3-pentafluoropropyl (meth)acrylate and 2-(perfluorohexyl)ethyl (meth)acrylate; and unsaturated amides such as (meth)acrylamide and N-(2-hydroxyethyl) (meth)acrylamide. Among them, (meth)acrylates are preferred to increase the yield of the copolymer. Such other acrylic monomers may be used alone or in combination of two or more of them.

Such other acrylic monomers are contained, if any, in a ratio is preferably from 1 to 80 mol %. If their ratio is more than 80 mol %, the ratio of the other components relatively decrease, and therefore the effect of the present invention can hardly be obtained sufficiently. Such other acrylic monomers can be used for adjusting the solubility or hydrophobicity and controlling the molecular weight of the acryl-soluble resin.

As examples of the most preferable ratio of each monomer constituting the alkali-soluble resin copolymer, the ratio of the carboxyl group-containing acrylic monomer is from 5 to 20 mol %, the ratio of the hydroxyl group-containing acrylic monomer is from 20 to 30 mol %, the ratio of the N-substituted maleimide is from 20 to 40 mol %, and the ratio of other acrylic monomers is from 10 to 55 mol %.

The method for obtaining the alkali-soluble resin copolymer is not particularly limited. The copolymer is usually produced by radical polymerization of the above-mentioned monomers in a polymerization solvent. Further, if necessary, the monomers may be polymerized with protection of functional groups in the monomers, and then deprotection may be also carried out.

The polymerization solvent to be used for producing the alkali-soluble resin copolymer may, for example, be an alcohol such as methanol, ethanol, propanol or butanol; an ether such as tetrahydrofuran or dioxane; an aromatic hydrocarbon such as benzene, toluene or xylene; a polar solvent such as N,N-dimethylformamide or N-methyl-2-pyrrolidone; an ester such as ethyl acetate, butyl acetate or ethyl lactate; an alkoxy ester such as methyl 3-methoxypropionate, methyl 2-methoxypropionate, ethyl 3-methoxypropionate, ethyl 2-methoxypropionate, ethyl 3-ethoxypropionate or ethyl 2-ethoxypropionate; a (di)glycol dialkyl ester such as ethylene glycol dimethyl ether, diethylene glycol dimethyl ether, diethylene glycol diethyl ether, diethylene glycol methylethyl ether, propylene glycol dimethyl ether or dipropylene glycol dimethyl ether; a (di)glycol monoalkyl ether such as ethylene glycol monomethyl ether, ethylene glycol monoethyl ether, diethylene glycol monomethyl ether, diethylene glycol monoethyl ether, propylene glycol monomethyl ether, propylene glycol monoethyl ether, dipropylene glycol monomethyl ether or dipropylene glycol monoethyl ether; a glycol monoalkyl ether ester such as propylene glycol monomethyl ether acetate, carbitol acetate or ethyl cellosolve acetate; and a ketone such as cyclohexanone, methyl ethyl ketone, methyl isobutyl ketone or 2-heptanone. Such polymerization solvents may be used alone or in combination of two or more of them.

The number average molecular weight of the alkali-soluble resin copolymer contained in the positive photosensitive resin composition of the present invention is from 1,000 to 200,000, preferably from 2,000 to 50,000, more preferably from 2,000 to 9,000 as calculated as polystyrene. If the number average molecular weight is less than 1,000, the resulting pattern tends to have an undesirable profile, the pattern retention tends to decrease, and the heat resistance of the pattern tends to be poor. On the other hand, if the number average molecular weight is more than 200,000, the coating properties of the photosensitive resin composition tends to be bad, the developability tends to deteriorate, and the resulting pattern tends to have an undesirable profile. Further, if the number average molecular weight is more than 9,000, the film tends to remain in a space of at most 50 μm in the pattern, and therefore the resolution will deteriorate. Accordingly, in the case where a fine pattern is formed, the number average molecular weight is preferably at most 9,000, particularly preferably be at most 8,000.

1,2-Quinone Diazide Compound

As the 1,2-quinone diazide compound contained in the positive photosensitive resin composition of the present invention, a compound having either hydroxyl group(s) or amino group(s) or having both hydroxyl group(s) and amino group(s) may be used, wherein preferably from 20 to 100%, particularly preferably from 30 to 90% of the hydroxyl groups and/or amino groups are esterified or amidated with 1,2-quinone diazide sulfonic acid.

The compound having hydroxyl group(s) may, for example, be a phenol compound such as phenol, o-cresol, m-cresol, p-cresol, hydroquinone, resorcinol, catechol, 4,4-isopropylidenediphenol, 1,1-bis(4-hydroxyphenyl)cyclohexane, 4,4'-dihydroxyphenylsulfone, 4,4-hexafluoroisopropylidenediphenol, 4,4',4"-trihydroxytriphenylmethane, 1,1,1-tris(4-hydroxyphenyl)ethane, 4,4'-[1-[4-[1-(4-hydroxyphenyl)-1-methylethyl]phenyl]ethylidene]bisphenol, 2,4-dihydroxybenzophenone, 2,3,4-trihydroxybenzophenone, 2,2',4,4'-tetrahydroxybenzophenone, 2,3,4,4'-tetrahydroxybenzophenone, 2,3,4,2',4'-pentahydroxybenzophenone or 2,5-bis(2-hydroxy-5-methylbenzylmethyl)phenone; an aliphatic alcohol such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate or butyl lactate.

Further, the compound having amino group(s) may, for example, be an aniline such as aniline, o-toluidine, m-toluidine, p-toluidine, 4-aminodiphenylmethane, 4-aminodiphenyl, o-phenylenediamine, m-phenylenediamine, p-phenylenediamine, 4,4'-diaminodiphenylmethane or 4,4'-diaminodiphenyl ether; and aminocyclohexane.

Further, the compound having both hydroxyl group(s) and amino group(s) may, for example, be an aminophenol such as o-aminophenol, m-aminophenol, p-aminophenol, 4-aminoresorcinol, 2,3-diaminophenol, 2,4-diaminophenol, 4,4'-diamino-4"-hydroxytriphenylmethane, 4-amino-4',4"-dihydroxytriphenylmethane, bis(4-amino-3-carboxy-5-hydroxyphenyl)ether, bis(4-amino-3-carboxy-5-hydroxyphenyl)methane, bis(4-amino-3-carboxy-5-hydroxyphenyl)sulfone, 2,2-bis(4-amino-3-carboxy-5-hydroxyphenyl)propane or 2,2-bis(4-amino-3-carboxy-5-hydroxyphenyl)hexafluoropropane; or an alkanolamine such as 2-aminoethanol, 3-aminopropanol or 4-aminocyclohexanol.

Among the 1,2-quinone diazide compounds, 4,4'-[1-[4-[1-(4-hydroxyphenyl)-1-methylethyl]phenyl]ethylidene]bisphenol esterified with 1,2-quinone diazide sulfonic acid is preferred in view of the balance between the solubilities of the exposed regions and the unexposed regions in the developer.

The content of the 1,2-quinone diazide compound in the positive photosensitive resin composition of the present invention is preferably from 5 to 100 parts by weight, more preferably from 10 to 50 parts by weight, particularly preferably from 10 to 30 parts by weight, based on 100 parts by weight of the alkali-soluble resin component. If the content of the 1,2-quinone diazide compound is less than 5 parts by weight based on 100 parts by weight of the alkali-soluble resin component, the difference in the solubility in the developer between the exposed regions and the unexposed regions will be small, and therefore patterning by development will be difficult. On the other hand, if the content exceeds 100 parts by weight, the 1,2-quinone diazide compound will not sufficiently be decomposed in a short-time exposure, and therefore the sensitivity tends to deteriorate.

Crosslinking Compound Having at Least Two Epoxy Groups

The crosslinking compound having at least two epoxy groups, contained in the positive photosensitive resin composition of the present invention, is not particularly limited. As specific examples, epoxy resins having a cyclohexene oxide structure such as EPOLEAD GT-401, EPOLEAD GT-403, EPOLEAD GT-301, EPOLEAD GT-302, CELLOXIDE 2021 and CELLOXIDE 3000 (manufactured by DAICEL CHEMICAL INDUSTRIES, LTD.); bisphenol A type epoxy resins such as Epicoat 1001, Epicoat 1002, Epicoat 1003, Epicoat 1004, Epicoat 1007, Epicoat 1009, Epicoat 1010 and Epicoat 828 (manufactured by Japan Epoxy Resins Co., Ltd.); bisphenol F type epoxy resins such as Epicoat 807 (manufactured by Japan Epoxy Resins Co., Ltd.); phenol novolac type epoxy resins such as Epicoat 152, Epicoat 154 (manufactured by Japan Epoxy Resins Co., Ltd.), EPPN 201 and EPPN 202 (manufactured by NIPPON KAYAKU CO., LTD.); cresol novolac type epoxy resins such as EOCN-102, EOCN-103S, EOCN-104S, EOCN-1020, EOCN-1025, EOCN-1027 (manufactured by NIPPON KAYAKU CO., LTD.) and Epicoat 180S75 (manufactured by Japan Epoxy Resins Co., Ltd.); alicyclic epoxy resins such as Denacol EX-252 (manufactured by Nagase ChemteX Corporation), CY175, CY177, CY179 (manufactured by CIBA-GEIGY A.G.), Araldit CY-182, Araldit CY-192, Araldit CY-184 (manufactured by CIBA-GEIGY A.G.), EPICLON 200, EPICLON 400 (manufactured by DAINIPPON INK AND CHEMICALS, INCORPORATED), Epicoat 871, Epicoat 872 (manufactured by Japan Epoxy Resins Co., Ltd.), ED-5661 and ED-5662 (manufactured by Celanese Chemicals, Ltd.); and aliphatic polyglycidyl ethers such as Denacol EX-611, Denacol EX-612, Denacol EX-614, Denacol EX-622, Denacol EX-411, Denacol EX-512, Denacol EX-522, Denacol EX-421, Denacol EX-313, Denacol EX-314 and Denacol EX-321 (manufactured by Nagase ChemteX Corporation) may be mentioned. Further, these crosslinking compounds may be used alone or in combination of two or more of them.

Among them, in view of the improvement of heat resistance and control of the pattern profile by the crosslinking temperature, an epoxy resin having a cyclohexene oxide structure is preferred.

The content of the crosslinking compound having at least two epoxy groups is preferably from 1 to 50 parts by weight, more preferably from 1 to 20 parts by weight, most preferably from 1 to 10 parts by weight, based on 100 parts by weight of the alkali-soluble resin component. If the content of the crosslinking compound having epoxy groups is less than 1 part by weight, the crosslinking density of the system will be insufficient, and therefore, the heat resistance and the solvent resistance after pattern formation will deteriorate. If it exceeds 50 parts by weight, the crosslinking compound will partly remain uncrosslinked, and therefore the heat resistance and the solvent resistance after pattern formation will deteriorate. Further, if the content of the crosslinking compound having epoxy groups is large, the storage stability of the photosensitive resin composition will be bad.

Surfactant

A surfactant contained in the positive photosensitive resin composition of the present invention is a fluorine type surfactant, a silicone type surfactant, a nonionic surfactant or the like, and it is not particularly limited. However, a fluorine type surfactant is preferred in the effect of improving the coating properties.

As specific examples of the fluorine type surfactant, EFTOP EF301, EF303, EF352 (manufactured by Tohkem Products Corporation); MEGAFACE F171, F173, R-30 (manufactured by DAINIPPON INK AND CHEMICALS, INCORPORATED); Fluorad FC430, FC431 (manufactured by SUMITOMO 3M Limited); Asahi Guard AG710, Surflon S-382, SC101, SC102, SC103, SC104, SC105 and SC106 (manufactured by Asahi Glass Company, Limited) may be mentioned, but it is not restricted thereto.

The content of the surfactant in the positive photosensitive resin composition of the present invention is preferably from 0.01 to 2 parts by weight, more preferably from 0.01 to 1 part by weight, most preferably from 0.01 to 0.1 part by weight, based on 100 parts by weight of the alkali-soluble resin component. If the content of the surfactant is more than 2 parts by weight, the coating film will be uneven. If it is less than 0.01 part by weight, striations or the like tend to form on the coating film. It is added preferably in an amount of from 0.04 to 1 part by weight to attain a film thickness of at least 2.5 μm.

With respect to the most preferred content of each component, for example, the positive photosensitive resin composition of the present invention contains the 1,2-quinone diazide compound in an amount of from 10 to 30 parts by weight, the crosslinking compound having at least two epoxy groups in an amount of from 1 to 10 parts by weight, and the surfactant in an amount of from 0.01 to 0.1 part by weight, based on 100 parts by weight of the alkali-soluble resin component.

Other Component which may be Contained

Needless to say, the positive photosensitive resin composition of the present invention preferably contains an adhesion promoter for improving the adhesion with a substrate after the development. As specific examples of such an adhesion promoter, chlorosilanes such as trimethylchlorosilane, dimethylvinylchlorosilane, methyldiphenylchlorosilane and chloromethyldimethylchlorosilane; alkoxysilanes such as trimethylmethoxysilane, dimethyldiethoxysilane, methyldimethoxysilane, dimethylvinylethoxysilane, diphenyldimethoxysilane and phenyltriethoxysilane; silazanes such as hexamethyldisilazane, N,N'-bis(trimethylsilyl)urea, dimethyltrimethylsilylamine and trimethylsilylimidazole; silanes such as vinyltrichlorosilane, γ-chloropropyltrimethoxysilane, γ-aminopropyltriethoxysilane, γ-methacryloxypropyltrimethoxysilane and γ-glycidoxypropyltrimethoxysilane; heterocyclic compounds such as benzotriazole, benzimidazole, indazole, imidazole, 2-mercaptobenzimidazole, 2-mercaptobenzthiazole, 2-mercaptobenzoxazole, urazole, thiouracil, mercaptoimidazole and mercaptopyrimidine; ureas such as 1,1-dimethylurea and 1,3-dimethylurea; and thiourea compounds may be mentioned.

Such adhesion promoters are usually used in a ratio of at most 20 parts by weight, preferably from 0.05 to 10 parts by weight, particularly preferably from 1 to 10 parts by weight, based on 100 parts by weight of the alkali-soluble resin component.

The positive photosensitive resin composition of the present invention may also contain a pigment, a dye, a storage stabilizer or an antifoaming agent, as the case requires.

Positive Photosensitive Resin Composition

The positive photosensitive resin composition of the present invention can readily be prepared by mixing the above-mentioned respective components uniformly. The composition is usually used in the form of a solution in an appropriate solvent, and, for example, prepared in the form of a solution by dissolving an alkali-soluble resin in a solvent, and then mixing with the resulting solution, a 1,2-quinone diazide compound, a crosslinking compound having at least two epoxy groups, a surfactant and other components in the prescribed ratios, as the case requires. As such a solvent, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate or butyl lactate may, for example, be used. Such organic solvents are used alone or in combination of two or more of them.

Further, a high boiling solvent such as propylene glycol monobutyl ether, propylene glycol monobutyl ether acetate or the like can be mixed before use. Among these solvents, propylene glycol monomethyl ether, propylene glycol monomethyl ether acetate, ethyl lactate, butyl lactate and cyclohexanone are preferred for improving the leveling property.

When the positive photosensitive resin composition of the present invention is in the form of a solution, the solid content is not particularly limited so long as each component is dissolved uniformly. It is usually used at a solid content within a range preferably of from 1 to 50 weight %, particularly preferably of from 20 to 45 weight % in view of efficiency in processing. The viscosity of the solution is preferably from 5 to 60 mPa·s, particularly preferably from 10 to 40 mPa·s. Further, the positive photosensitive resin composition solution prepared as described above is preferably used after filtrated through a filter having a pore size of approximately 0.5 μm or the like. The positive photosensitive resin composition solution thus prepared is also excellent in long-term storage stability at room temperature.

The positive photosensitive resin composition solution of the present invention is applied on a substrate such as a glass substrate, a silicone wafer, an oxide film or a nitride film, then predried at from 80 to 130° C. for from 30 to 600 seconds, to form a coating film.

The coating film is irradiated with light through a mask having a prescribed pattern mounted thereon, and then developed with an alkaline developer, to wash off the undeveloped regions, leaving a relief pattern having a sharp edge surface. The developer to be used may be any aqueous alkaline solution, and an aqueous solution of an alkali metal hydroxide such as potassium hydroxide, sodium hydroxide, potassium carbonate or sodium carbonate; an aqueous solution of a quaternary ammonium hydroxide such as tetramethylammonium hydroxide, tetraethylammonium hydroxide or choline; or an aqueous solution of an amine such as ethanolamine, propylamine or ethylenediamine may, for example, be mentioned.

An aqueous solution as the alkaline developer usually has a concentration of at most 10 wt % and is preferably used at a concentration of from 0.5 to 3.0 wt %. The photosensitive resin composition of the present invention can be developed with 2.38 wt % aqueous tetraethylammonium hydroxide solution usually used for photoresists, without problems such as swelling. Further, an alcohol or a surfactant can be added before use. These are respectively blended within a range preferably of from 0.05 to 10 parts by weight based on 100 parts by weight of the developer.

The development is usually carried out for from 15 to 180 seconds by loading, dipping or any other methods. After the development, the substrate is washed with running water for from 20 to 90 seconds, then dried with compressed air or compressed nitrogen to remove moisture on the substrate, and thus, a patterned coating film is formed. Then, the patterned coating film is entirely irradiated with light produced by a high-pressure mercury-vapor lamp to completely decompose the 1,2-quinone diazide compound remaining in the patterned coating film, and then postbaked by means of a hotplate, an oven or the like. Accordingly, a coating film having excellent heat resistance, transparency, planarization property, low water absorption and chemical resistance, and having a good relief pattern can be obtained. The postbake may, for example, be carried out at a temperature of from 140 to 250° C., for from 5 to 30 minutes on a hotplate or for from 30 to 90 minutes on an oven.

Method for Arbitrarily Obtaining a Pattern having a Semicircular or Trapezoidal Section The positive photosensitive resin composition of the present invention can arbitrarily give a pattern having a semicircular or trapezoidal section by changing the postbake conditions.

In order to obtain a pattern having a semicircular section, postbake is carried out in one step by heating the composition at a relatively high temperature such as from 170 to 250° C., preferably from 190 to 220° C.

On the other hand, in order to obtain a pattern having a trapezoidal section, postbake is carried out in two steps, by heating the composition for from 10 to 30 minutes at a relatively low temperature such as from 120 to 160° C., preferably from 130 to 150° C. in the first step, and then at a relatively high temperature such as from 170 to 250° C., preferably from 190 to 250° C. in the second step.

Now, the present invention will be described in further detail with reference to Examples, but it should be understood that the present invention is by no means restricted thereto.

EXAMPLE 1

The Respective Components of the Composition

Alkali-soluble resin: Copolymer (number average molecular weight: 4100 (calculated as polystyrene)) consisting of 13.5 mol % methacrylic acid, 35.3 mol % N-cyclohexylmaleimide, 25.5 mol % hydroxyethyl methacrylate and 25.7 mol % methyl methacrylate as monomers.

1,2-Quinone diazide compound: A sensitizer produced by condensation reaction of 1 mol of 4,4'-[1-[4-[1-(4-hydroxyphenyl)-1-methylethyl]phenyl]ethylidene]bisphenol and 2 mol of 1,2-naphthoquinone-2-diazide-5-sulfonyl chloride (manufactured by TOYO GOSEI CO., LTD., P-200).

Crosslinking compound having at least two epoxy groups: GT-401 (manufactured by DAICEL CHEMICAL INDUSTRIES, LTD.) having a cyclohexene oxide structure with four functional groups.

Surfactant: MEGAFACE R-30 (manufactured by DAINIPPON INK AND CHEMICALS, INCORPORATED) containing fluorine.

Preparation of Positive Photosensitive Resin Composition 22 g of the alkali-soluble resin was dissolved in 78 g of propylene glycol monomethyl ether acetate, and then 6.6 g of the 1,2-quinone diazide compound, 1 g of the crosslinking compound having at least two epoxy groups, 0.01 g of the surfactant and 1 g of γ-methacryloxypropyltrimethoxysilane as an adhesion promoter were added thereto. Then, the solution was stirred for an hour at room temperature to give a composition solution (1) as a positive photosensitive resin composition of the present invention. The viscosity of the composition solution (1) was 13.9 mPa·s, and the viscosity did not change even if the composition solution (1) was left standing for three months at room temperature.

Evaluation of Water Absorption by Cured Film

The composition solution (1) was applied on a silicon oxide-coated glass substrate with a spin coater, and then prebaked on a hotplate for 90 seconds at 120° C. to form a coating film having a film thickness of 1.7 μm. The entire surface of the resulting coating film was irradiated with ultraviolet rays having a light intensity of 9 mW/cm$^2$ at 420 nm for 30 seconds (270 mJ/cm$^2$). After the irradiation with ultraviolet rays, the coating film was postbaked by heating at 200° C. for 15 minutes to form a cured film having a film thickness of 1.5 μm. The cured film thus formed was observed with an optical microscope, but no defects such as striations were found.

The water absorption by the cured film during 24 hours of standing in a humidity of 50% at 23° C. and the water absorption during 2 hours of boiling were measured by raising the temperature up to 120° C. by using a thermogravimetric analyzer TG-DTA manufactured by MAC Science Co., Ltd. The water absorption during 24 hours at 23° C. in a humidity of 50% was 1.6%, and the water absorption during 2 hours of boiling was 1.7%.

Evaluation of Heating Resistance of Cured Film

A cured film prepared in the same manner as described above was stripped from the substrate, and the heat resistance was evaluated by TG-DTA measurement. As a result, thermal decomposition starting temperature was 270° C., and the 5% weight loss temperature was 330° C. Further, the glass transition temperature was at least 200° C.

Evaluation of Transparency of Cured Film

A quartz substrate was used instead of a silicon oxide-coated glass substrate, and a cured film was obtained in the same manner as described above. The cured film was analyzed at wavelengths of from 200 to 800 nm by using a spectrophotometer, and the transmittance was found to be 96% at 400 nm.

Evaluation of Photosensitive Properties

A composition solution (1) was applied on a silicon oxide-coated glass substrate with a spin coater, and then prebaked on a hotplate for 90 seconds at 120° C. to form a coating film having a film thickness of 1.7 μm. The coating film was irradiated through a test mask with ultraviolet rays having a light intensity of 9 mW/cm$^2$ at 420 nm for 10 seconds (90 mJ/cm$^2$) emitted by an ultraviolet irradiation apparatus (manufactured by Canon Inc., PLA-501), and then immersed in a 2.38% TMAH aqueous solution (manufactured by TOKYO OHKA KOGYO CO., LTD., NMD-3) for 45 seconds at 23° C. for development. Then the substrate was washed with running ultrapure water for 20 seconds to give a positive pattern.

After the development, the film thickness of the unexposed part was approximately 1.7 μm, and no film reduction was observed. The pattern resolution was such that the pattern was formed up to a line/space of 3 μm without peeling of the pattern. Then, the entire surface was irradiated with ultraviolet ray having a light intensity of 9 mW/cm$^2$ at 420 nm for 30 seconds (270 mJ/cm$^2$), and the film was postbaked for 15 minutes at 200° C. to obtain a pattern having a thickness of 1.5 μm. Geometric examination of the pattern using a scanning electron microscope revealed that the pattern had a semicircular section as shown in FIG. 1.

Sensitivity Evaluation

In the above pattern formation, ultraviolet ray irradiation was carried out while changing the ultraviolet dose before development by 10 mJ/cm$^2$ at a time, and the minimum ultraviolet dose required to completely dissolve the exposed part in a developer was measured, and then the exposed part completely dissolved at a dose of 50 mJ/cm$^2$.

EXAMPLE 2

Figure 2:
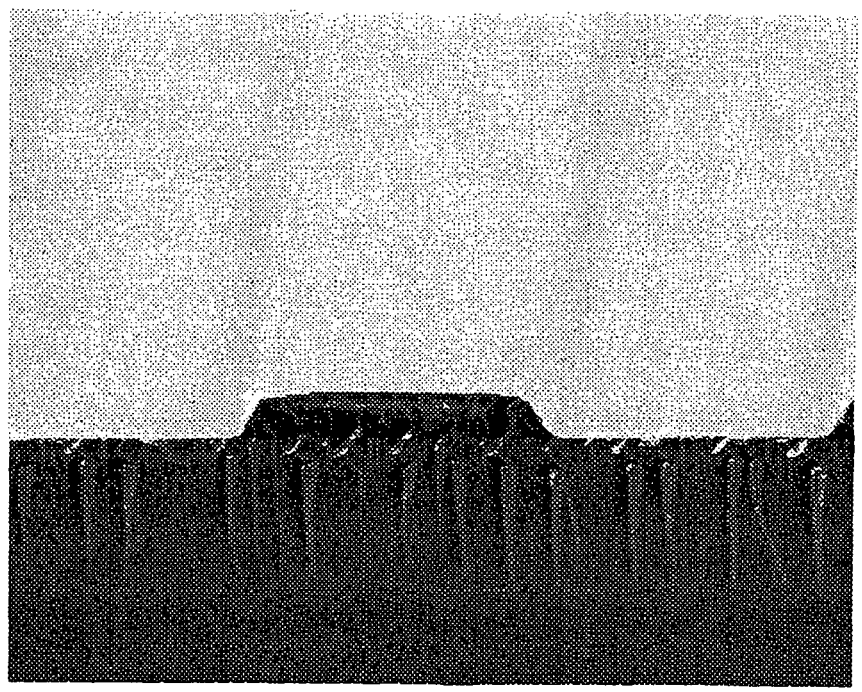
FIG. 2 is a scanning electron micrograph of the pattern having a trapezoidal section obtained in Example 2.

In the evaluation of photosensitive properties in Example 1, instead of the one step postbake for 15 minutes at 200°C., postbake was carried out in two steps by heating a film on a hotplate at 140° C. for 15 minutes and then at 200° C. for 15 minutes. The resulting pattern had a trapezoidal section as shown in FIG. 2.

EXAMPLE 3

A composition solution (2) as a positive photosensitive resin composition of the present invention was obtained in the same manner as in Example 1 except that a copolymer (number average molecular weight 3900 (calculated as polystyrene) consisting of 9 mol % methacrylic acid, 32.8 mol % N-cyclohexylmaleimide, 25.4 mol % hydroxyethyl methacrylate and 32.8 mol % methyl methacrylate was used as an alkali-soluble resin. The viscosity of the composition solution (2) was 13.0 mPa·s and did not change even if the composition solution (2) was left standing for three months at room temperature.

The composition solution (2) was evaluated in the same manner as in Example 1. As a result, no defects such as striations were found in the cured film, the transmittance was 96% at 400 nm, the 5% weight loss temperature was 330° C., and the glass transition temperature was at least 200° C.

Further, in the evaluation of the photosensitive properties, no film reduction was observed in the unexposed part after development, the pattern resolution was such that the pattern was formed up to a line/space of 3 μm without peeling of the pattern, and the section of the pattern was semicircular. The sensitivity was 50 mJ/cm$^2$.

EXAMPLE 4

A composition solution (3) as a positive photosensitive composition of the present invention was obtained in the same manner as in Example 1 except that cyclohexanone was used instead of propylene glycol monomethyl ether acetate as a solvent. The viscosity of the composition solution (3) was 13.9 mPa·s and did not change even if the composition solution (3) was left standing for three months at room temperature.

The composition solution (3) was evaluated in the same manner as in Example 1. As a result, no defects such as striations were found in the cured film, and the transmittance at 400 nm was 96%, the 5% weight loss temperature was 330° C., and the glass transition temperature was at least 200° C.

Further, in the evaluation of the photosensitive properties, no film reduction was observed in the unexposed part after development, the pattern resolution was such that the pattern was formed up to a line/space of 3 μm without peeling of the pattern, and the section of the pattern was trapezoidal. The sensitivity was 50 mJ/cm$^2$.

COMPARATIVE EXAMPLE 1

A composition solution (4) was obtained in the same manner as in Example 1 except that a copolymer (number average molecular weight 4100 (calculated as polystyrene)) consisting of 13.5 mol % methacrylic acid, 25.5 mol % hydroxyethyl methacrylate and 61 mol % methyl methacrylate was used as an alkali-soluble resin.

The composition solution (4) was evaluated in the same manner as in Example 1. As a result, no defects such as striations were found in the cured film, and the transmittance at 400 nm was 96%, but the 5% weight loss temperature was 290° C., which indicates inadequate heat resistance.

Further, in the evaluation of the photosensitive properties, no film reduction was observed in the unexposed part after development, the pattern resolution was such that the pattern was formed up to a line/space of 3 μm without peeling of the pattern, and the section of the pattern was semicircular. The sensitivity was 50 mJ/cm$^2$.

COMPARATIVE EXAMPLE 2

In Comparative Example 1, postbake was carried out in two steps like in Example 2, by heating the film on a hotplate at 140° C. for 15 minutes, and then at 200° C. for 15 minutes instead of the one step postbake for 15 minutes at 200° C. However, the resulting pattern had a semicircular section, not a trapezoidal section as shown in FIG. 2.

EXAMPLE 5

A composition solution (5) was obtained in the same manner as in Example 1 except that an alkali-soluble resin having a number average molecular weight of 10,000 was used.

The composition solution (5) was evaluated in the same manner as in Example 1. As a result, no defects such as striations were found in the cured film, the transmittance at 400 nm was 96%, the 5% weight loss temperature was 330° C., and the glass transition temperature was at least 200° C.

Further, in the evaluation of the photosensitive properties, no film reduction was observed in the unexposed part after the development, but a film remnant was observed in the pattern up to a line/space of 50 μm after the development, and the phenomenon was not prevented even if the development period was extended. The section of the pattern was semicircular.

COMPARATIVE EXAMPLE 3

The procedure in Example 1 was followed without addition of a surfactant to obtain a composition solution (6). The composition solution (6) was evaluated in the same manner as in Example 1. As a result, the cured film had striations, and therefore a satisfactory film was not obtained.

INDUSTRIAL APPLICABILITY

The positive photosensitive resin composition of the present invention has positive photosensitive properties such as high sensitivity and high resolution, is easy to etch with an alkaline aqueous solution, and readily gives a coating film having a fine relief pattern with high dimensional accuracy upon exposure to light through a mask with a prescribed pattern.

Further, the positive photosensitive resin composition of the present invention has high-sensitivity, can be developed with commonly used 2.38 wt % tetramethylammonium hydroxide aqueous solution, and further, can arbitrarily form a pattern having a semicircular or trapezoidal section depending on the postbake conditions. Further, upon curing after pattern formation, a pattern having excellent properties such as transmittance, heat resistance, planarization property or resistance to water absorption can be readily formed.

The positive photosensitive resin composition of the present invention is suitable as a material for forming an interlayer dielectric film of a TFT to be used for an LCD, a protective or planarization film for a color filter, an uneven film under an Al film used as a reflector of a reflective display, a microlens material, a dielectric film in an organic EL device or the like.

What is claimed is:

1. A positive photosensitive resin composition, comprising:
   an alkali-soluble resin, a 1,2-quinone diazide compound, a crosslinking compound having at least two epoxy groups and a surfactant,
   wherein the alkali-soluble resin is a copolymer comprising copolymerized units of a carboxyl group-containing acrylic monomer, a hydroxyl group-containing acrylic monomer and an N-substituted maleimide as essential components.

2. The positive photosensitive resin composition according to claim 1, which comprises the 1,2-quinone diazide compound in an amount of from 5 to 100 parts by weight, the crosslinking compound having at least two epoxy groups in an amount of from 1 to 50 parts by weight, and the surfactant in an amount of from 0.01 to 2 parts by weight, based on 100 parts by weight of the alkali-soluble resin component.

3. The positive photosensitive resin composition according to claim 1, wherein the number average molecular weight of the copolymer is from 2,000 to 9,000.

4. The positive photosensitive resin composition according to claim 1, wherein the copolymer comprises copolymerized units of the carboxyl group-containing acrylic monomer in an amount of from 5 to 30 mol %, the hydroxyl group-containing acrylic monomer in an amount of from 5 to 50 mol % and the N-substituted maleimide in an amount of from 10 to 70 mol %.

5. The positive photosensitive resin composition according to claim 1, wherein the surfactant is a fluorine-containing surfactant.

6. The positive photosensitive resin composition according to claim 1, wherein the alkali-soluble resin comprises copolymerized units of at least one carboxyl group-containing acrylic monomer selected from the group consisting of acrylic acid and methacrylic acid.

7. The positive photosensitive resin composition according to claim 1, wherein the alkali-soluble resin comprises the carboxyl group-containing acrylic monomer in an amount of from 5 to 20 mol %, the hydroxyl group-containing acrylic monomer in an amount of from 20 to 30 mol %, and the N-substituted maleimide in an amount of from 20 to 40 mol %.

8. The positive photosensitive resin composition according to claim 1, wherein the hydroxyl group-containing acrylic monomer is at least one selected from the group consisting of a 2-hydroxyethyl acrylate, 2-hydroxypropyl acrylate, 2-hydroxyethyl methacrylate and 2-hydroxypropyl methacrylate.

9. The positive photosensitive resin composition according to claim 1, wherein the N-substituted maleimide is at least one selected from the group consisting of cyclohexylmaleimide, phenylmaleimide, methylmaleimide and ethylmaleimide.

10. The positive photosensitive resin composition according to claim 1, wherein the alkali-soluble resin composition comprises copolymerized units of the carboxyl group-containing acrylic monomer in an amount of from 5 to 20 mol %, the hydroxyl group-containing acrylic monomer in an amount of from 20 to 30 mol %, and the N-substituted maleimide in an amount of from 20 to 40 mol %, and further comprises copolymerized units of one or more other acrylic monomers in an amount of from 10 to 55 mol %.

11. The positive photosensitive resin composition according to claim 1, wherein the 1,2-quinone diazide has hydroxyl groups, amino groups or both hydroxyl groups and amino groups, that are esterified or amidated with 1,2-quinone diazide sulfonic acid.

12. The positive photosensitive resin composition according to claim 1, wherein the 1,2-quinone diazide compound is 4,4'-[1-[4-[1-(4-hydroxyphenyl)-1-methylethyl]phenyl]ethylidene]bisphenol esterified with 1,2-quinone diazide sulfonic acid.

13. The positive photosensitive resin composition according to claim 1, wherein the crosslinking compound is an epoxy resin having a cyclohexene oxide structure.

14. The positive photosensitive resin composition according to claim 1, further comprising a silane adhesion promoter.

15. The positive photosensitive resin composition according to claim 1, wherein the alkali-soluble resin comprises co-polymerized monomer units of methacrylic acid, N-cyclohexyl maleimide, hydroxyethyl methacrylate and methyl methacrylate; the 1,2-quinone diazide compound is produced by condensation of 4,4'-[1-[4-[1-(4-hydroxyphenyl)-1-methylethyl]phenyl]ethylidene]bisphenol with 1,2-naphthoquinone-2-diazide-5-sulfonyl chloride; the crosslinking compound has a cyclohexene oxide structure with four functional groups.

16. A method, comprising:
    applying the positive photosensitive resin composition according to claim 1 onto a substrate, then
    imagewise exposing the substrate,
    forming a first pattern, and
    postbaking to form a second pattern having a semicircular or trapezoidal section.

17. The method of claim 16, wherein the imagewise exposing and the forming include pre-drying the substrate after the applying, irradiating with light through a mask having a pattern mounted thereon, and developing with an alkaline developer, and
    wherein the postbaking is carried out after the imagewise exposing and the forming.

18. The method of claim 16, wherein the imagewise exposing and the forming include prebaking the substrate after the applying, irradiating the prebaked substrate with ultraviolet rays, then developing with an aqueous solution, then washing with water, and then irradiating with ultraviolet rays; and
    wherein the postbaking is carried out after the imagewise exposing and the forming.

* * * * *